US006981091B2

(12) United States Patent
Shimanek et al.

(10) Patent No.: US 6,981,091 B2
(45) Date of Patent: Dec. 27, 2005

(54) USING TRANSFER BITS DURING DATA TRANSFER FROM NON-VOLATILE TO VOLATILE MEMORIES

(75) Inventors: Schuyler E. Shimanek, Albuquerque, NM (US); Roy D. Darling, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 860 days.

(21) Appl. No.: 10/040,001

(22) Filed: Oct. 25, 2001

(65) Prior Publication Data

US 2003/0084230 A1    May 1, 2003

(51) Int. Cl.$^7$ .............................................. G06F 12/16
(52) U.S. Cl. ...................... 711/103; 714/725; 716/16; 326/39
(58) Field of Search ...................... 365/185.22, 189.07, 365/185.14, 185.29, 218; 711/101, 103, 170; 713/1; 714/725, 763, 819

(56) References Cited

U.S. PATENT DOCUMENTS

| 4,811,294 A | | 3/1989 | Kobayashi et al. |
| 5,313,425 A | * | 5/1994 | Lee et al. .................... 365/201 |
| 5,784,391 A | * | 7/1998 | Konigsburg ................ 714/773 |
| 5,898,618 A | | 4/1999 | Lakkapragada et al. |
| 6,233,717 B1 | * | 5/2001 | Choi .......................... 714/805 |
| 6,539,504 B1 | * | 3/2003 | Knefel ........................ 714/718 |
| 6,584,017 B2 | * | 6/2003 | Maayan et al. ........ 365/185.22 |

FOREIGN PATENT DOCUMENTS

WO    WO 97/03444    1/1997

OTHER PUBLICATIONS

IBM, "Error Check and Correction for Soft Error of Dynamic Random-Access Memory," Mar. 1989, IMB Technical Disclosure Bulletin, 31, pps 58-60.*
Xilinx, Inc.; "The Programmable Logic Data Book 2000"; available from Xilinx, Inc., 2100 Logic Drive, San Jose, California 95124; pp. 6-1 through 6-13.

* cited by examiner

Primary Examiner—Denise Tran
(74) Attorney, Agent, or Firm—Lois D. Cartier

(57) ABSTRACT

Structures and methods for transferring data from non-volatile to volatile memories. An extra bit, called a "transfer bit", is included in each data word. The transfer bit is set to the programmed value, and is monitored by a control circuit during the memory transfer. If the supply voltage is sufficient for correct programming, the transfer bit is read as "programmed", and the data transfer continues. If the supply voltage is below the minimum supply voltage for proper programming, the transfer bit is read as "erased", and the data transfer is reinitiated. In one embodiment, a second transfer bit set to the "erased" value is included in each word.

22 Claims, 6 Drawing Sheets

USING TRANSFER BITS DURING DATA TRANSFER FROM NON-VOLATILE TO VOLATILE MEMORIES

FIELD OF THE INVENTION

The invention relates to data transfer between non-volatile and volatile memories. More particularly, the invention relates to the use of transfer bits to improve the reliability of data transfer from non-volatile to volatile memories, for example, in the transfer of configuration data in programmable logic devices.

BACKGROUND OF THE INVENTION

Programmable logic devices (PLDs) are a well-known type of digital integrated circuit that may be programmed by a user to perform specified logic functions. One type of PLD, the complex programmable logic device (CPLD), typically includes a group of input/output (I/O) cells, a corresponding set of programmable function blocks, and an interconnect matrix called a switch matrix. The I/O cells provide communication between the CPLD and other devices or systems. The function blocks generate a plurality of P-terms (product terms) and, from these P-terms, one or more SOP (sum of products) output signals. The switch matrix provides internal communication between and among the function blocks and I/O cells.

The functionality of the I/O cells, the function blocks, and the switch matrix is controlled by data bits stored in memory cells also included in the CPLD. Therefore, the functionality of the CPLD is defined by writing data values into these memory cells. This process is called "programming" or "configuration", and the data values written to the memory cells are called "programming data" or "configuration data". CPLDs are non-volatile devices, meaning that a CPLD, once programmed, need not be reprogrammed after power is removed from and restored to the device.

One known variety of CPLDs is the "CoolRunner™" CPLD family manufactured by Xilinx, Inc. CoolRunner devices are described in pages 6-1 through 6-13 of "The Programmable Logic Data Book 2000", available from Xilinx, Inc., of San Jose, Calif., which pages are incorporated herein by reference.

CoolRunner CPLDs are low-power devices that incorporate a number of features designed to reduce power consumption in the device. One such feature is the inclusion of two sets of memory cells, one non-volatile (as in other CPLDs) and one volatile. When the device is programmed, as in other CPLDs, the programming data is written to a group of non-volatile memory cells. However, these non-volatile memory cells do not directly control the functionality of the device. Instead, when the device is inserted in a system and power is applied, the programming data is copied from the non-volatile memory cells to a group of volatile memory cells. It is the data in these volatile memory cells that controls the functionality of the I/O cells, the function blocks, and the switch matrix in CoolRunner CPLDs. Because volatile memory consumes less power than similarly-loaded non-volatile memory, this unique architectural feature contributes to the low power consumption of the CoolRunner devices.

However, this data transfer may not be error-free if the data transfer occurs when the supply voltage is either too low or too noisy.

One known method to reduce or eliminate errors caused by a low supply voltage is to include safeguards in the CPLD to hold off the data transfer until a minimum supply voltage is reached. For example, a reference circuit such as a bandgap circuit or a diode stack can be used to set a minimum supply voltage. However, system supply voltages are dropping, e.g., from 3.3 volts to 1.8 volts to 1.5 volts and below. As they drop, the margin between the system supply voltage and a controllable minimum supply voltage is reduced to the point where temperature variations and silicon manufacturing tolerances render the difference negligible. Under certain conditions, and given a sufficiently low system supply voltage, there may be cases where data transfer from non-volatile to volatile memory is not triggered at all.

Errors caused by a noisy supply voltage can also be problematical. While ramping up, the supply voltage can rise above the minimum supply voltage, triggering the memory transfer, then "glitch" low, momentarily falling back below the minimum supply voltage. If this glitch is undetected, faulty data can be loaded into one or more volatile memory cells. Most problematic is the transfer of programmed (low, or conducting) values. When the supply voltage drops below the minimum supply voltage, the data transfers as erased (high, or non-conducting) data.

In some CPLDs, the minimum supply voltage signal is gated by another signal that senses the supply voltage is high enough to permit non-volatile to volatile memory data transfer. However, this arrangement only detects the supply voltage at the beginning of the data transfer. (This solution is similar to the well-known technique of supplying a "dummy word" in a memory array, which is used to test the memory functionality.) If the supply voltage drops at any time during the memory transfer, even if only transiently, data transfer errors can occur.

Therefore, it is desirable to introduce structures and methods that reduce the incidence of data transfer errors between non-volatile and volatile memory.

SUMMARY OF THE INVENTION

The invention provides structures and methods for transferring data from non-volatile to volatile memories, e.g., transferring configuration data from non-volatile to volatile memory in CPLDs.

CPLD memory is arranged in words, each of which contains multiple bits, typically from a few hundred to several thousand bits. During the power-up and initialization sequence of the CPLD, non-volatile memory data is sensed by a sense amplifier and written to the volatile memory array on a word by word basis. Typically, sensing an erased (high, or non-conducting) non-volatile cell does not pose a problem even at very low voltages. However, sensing a programmed (low, or conducting) non-volatile cell does pose a problem at very low voltages. Sufficient voltage bias must be applied to a programmed cell that it can sink enough current to switch the state of the sense amplifier.

The invention addresses this problem by placing an extra bit, called a "transfer bit", in each data word transferred between the two memories. Preferably, the transfer bit is in the same location in each word. The transfer bit is preferably set to the programmed value, because the transfer of these values is more problematic, as described above.

During the memory transfer, the sense amplifier reads the state of the transfer bit and sends the results back to a control circuit. If the transfer bit is stored in the non-volatile memory as a "programmed" value and the supply voltage is sufficient for correct data transfer, the transfer bit is read as "programmed". If the supply voltage is below the minimum supply voltage for proper data transfer, the transfer bit is read as "erased".

The control circuit may include, for example, a latch that is reset before the data transfer begins. As long as the transfer bit is sensed as "programmed" for each word, the value in the latch remains reset, and the initialization continues to completion. If the transfer bit is sensed as "erased" for any word, the value in the latch is set, and the data transfer is restarted at the first transferred word.

Thus, the inclusion of the transfer bit in the CPLD programming word ensures that each word in the non-volatile memory is properly sensed and written to the volatile memory.

In one embodiment, an "erased" transfer bit triggers an immediate restart of the data transfer. In another embodiment, the value in the latch is not checked until the data transfer is complete. At that time, if one or more transfer bits were incorrectly detected as "erased", then the entire data transfer sequence is repeated. In one embodiment, the entire data transfer takes about 20–40 microseconds (about 200 nanoseconds per word). Therefore, the additional delay incurred by repeating the entire data transfer sequence is relatively insignificant.

In another embodiment, a second transfer bit is included in each word. This second transfer bit is an "erased" bit. Thus, one transfer bit is programmed and the other is erased. If the "erased" transfer bit is sensed as "programmed" for any word, that may indicate, for example, that a dynamic pre-charge of the sense amplifiers was not successful.

In other embodiments, particularly those with very large words, multiple "programmed" and/or multiple "erased" transfer bits are included. The "programmed" transfer bits can be ORed, and the "erased" transfer bits can be ANDed, to determine whether or not the transfer was successful.

In one embodiment, one or more "erased" transfer bits are included in each word stored in the non-volatile memory, and "programmed" transfer bits are not included. This embodiment can be used, for example, in situations where the supply voltage is very stable and is known to rise monotonically.

The addition of one or two transfer bits to each word, along with the associated support circuitry, adds little die area. In one embodiment, the addition of two transfer bits adds less than 0.1% die area to a CPLD product. Hence, the additional cost is negligible, while the improved reliability of the data transfer is of significant value.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

The present invention is believed to be applicable to a variety of electronic devices. The present invention has been found to be particularly applicable and beneficial for programmable logic devices (PLDs) such as Complex Programmable Logic Devices (CPLDs). While the present invention is not so limited, an appreciation of the present invention is presented by way of specific examples, in this instance with a CPLD including both non-volatile and volatile memories.

Figure 1:
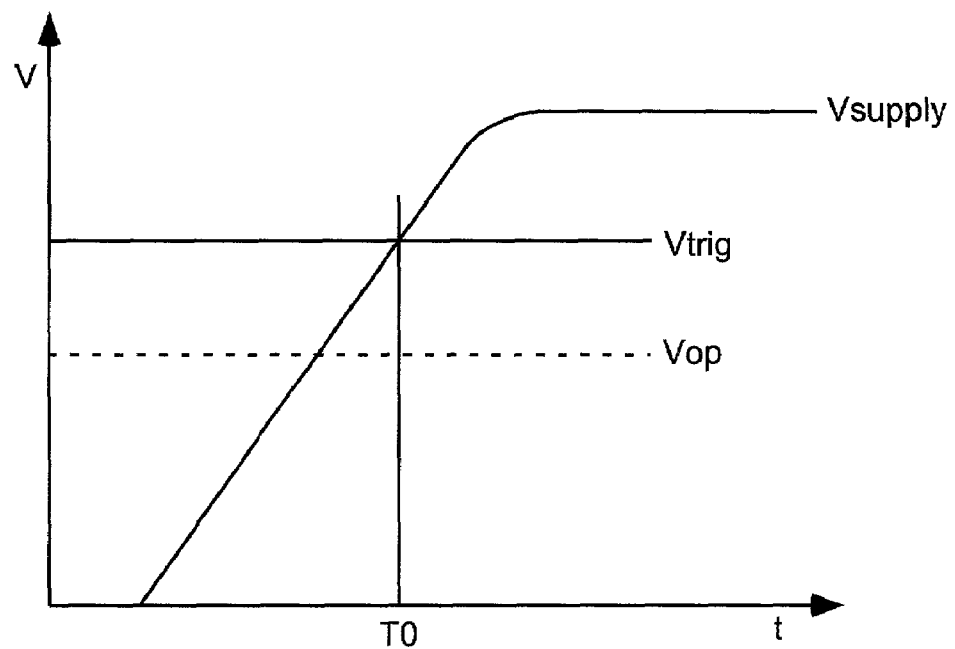
FIG. 1 shows the ramping up of a CPLD voltage supply in the ideal case.

FIG. 1 shows a first case in the power-up sequence of a CPLD. In FIG. 1, the operating voltage (the voltage sufficient to correctly transfer the data from the non-volatile to the volatile memory) is designated Vop. The triggering voltage (the voltage at which the data transfer is initiated) is designated Vtrig. The power supply for the CPLD is designated Vsupply. Clearly, FIG. 1 shows the ideal case, where the triggering voltage is higher than the operating voltage.

When the supply voltage rises to the value of the triggering voltage (at time T0), the data transfer is initiated. At this time, the supply voltage is sufficiently high so that the data transfer proceeds without error. In this case, the previously described prior art methods and structures work quite well.

Figure 2:
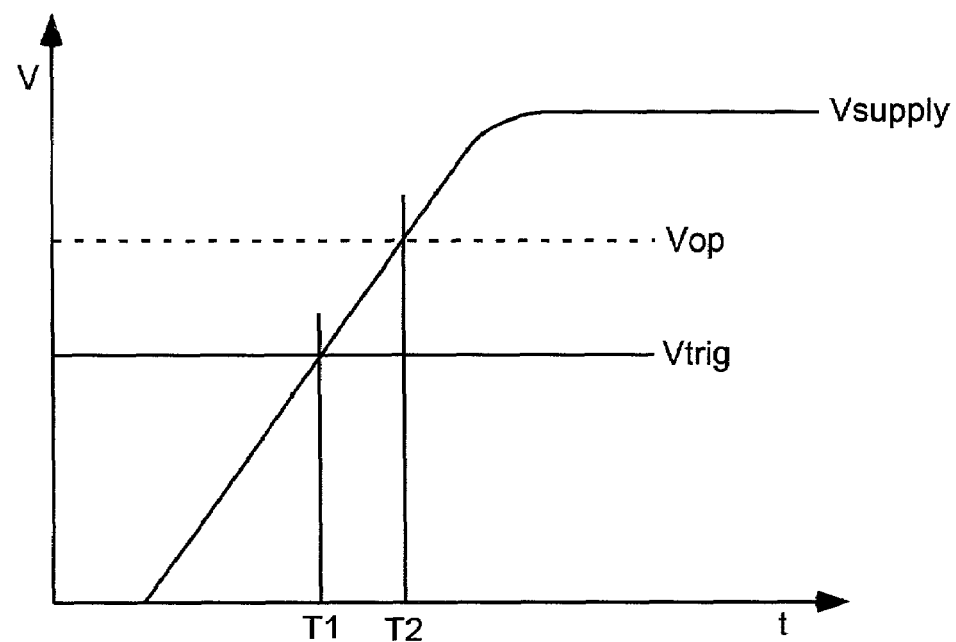
FIG. 2 shows the ramping up of a CPLD voltage supply when the trigger voltage is below the operating voltage.

FIG. 2 shows a second case in the CPLD power-up sequence. In this case, the triggering voltage is lower than the operating voltage. This case can occur, for example, at an extreme processing corner that alters Vtrig to an unusually low value, or if the operating margin of the non-volatile memory cells falls due to extended usage of the CPLD or other factors.

At time T1, the supply voltage reaches the triggering voltage, and data transfer begins. However, the supply voltage has not yet reached the operating voltage, so data transfer errors occur. If prior art methods and structures are used, the data is incorrectly transferred, and then retained in the volatile memory. When the methods and structures of the present invention are used, data transfer errors still occur, but the error is detected and corrected.

The first time a transfer bit with a "programmed" value is detected as "erased", the data transfer process is restarted. In fact, the first word of data (or the first few words) might be transferred many times before time T2, at which the supply voltage reaches the operating voltage and programmed values transfer correctly. In another embodiment, where the entire data transfer is allowed to finish before checking for invalid transfer bits, the supply voltage is more likely to be stable before restarting the data transfer.

Figure 3:
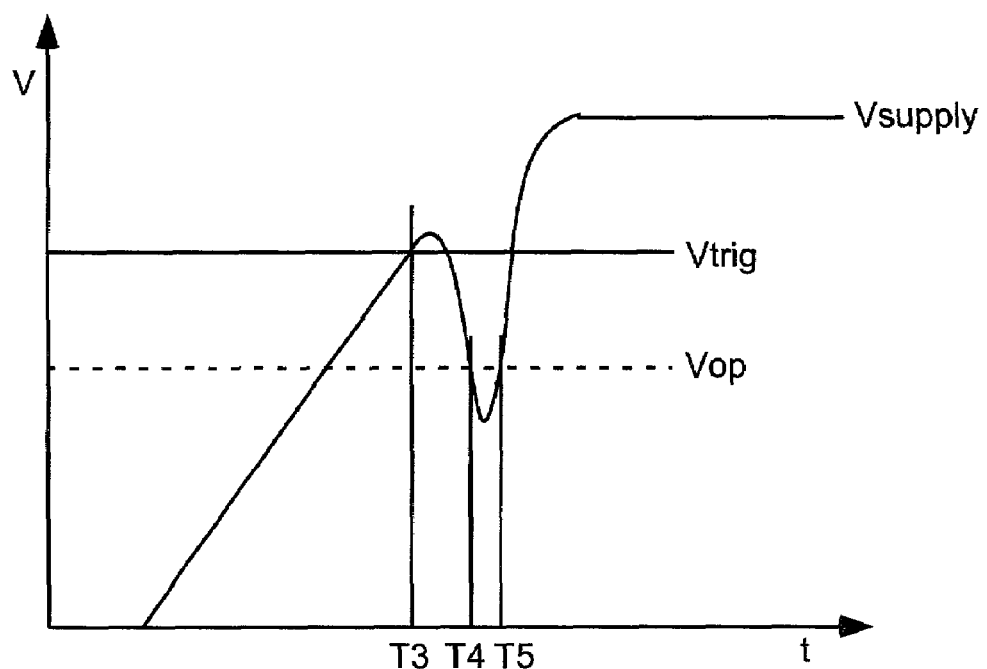
FIG. 3 shows the ramping up of a CPLD voltage supply when the voltage supply "glitches" down below the operating voltage during power-up.

FIG. 3 shows a third case, in which the supply voltage rises high enough to trigger data transfer (time T3) and then falls back below the operating voltage at time T4. Clearly, prior art methods and structures fail in this case. When the methods and structures of the present invention are used, data transfer is restarted (repeatedly, if necessary) until the supply voltage rises back above the operating voltage at time T5.

Figure 4:
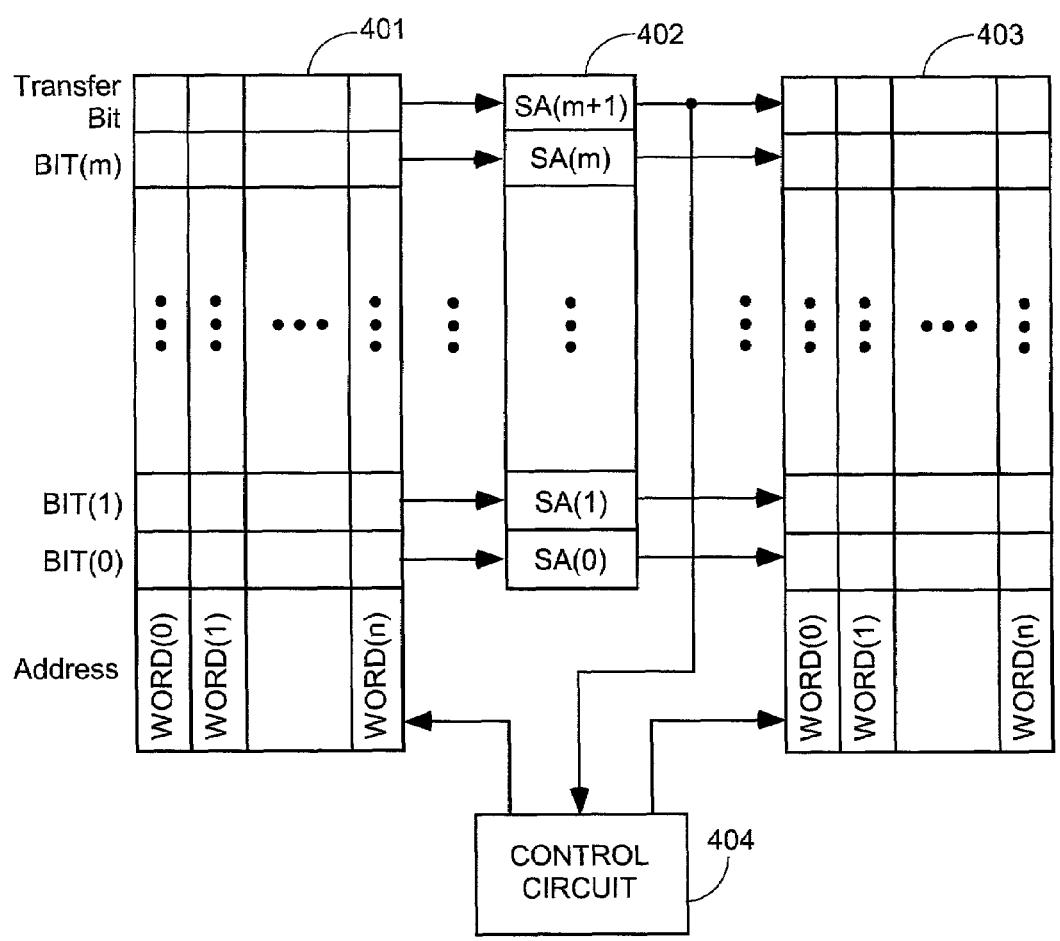
FIG. 4 is a block diagram of a circuit for transferring data from a non-volatile to a volatile memory according to one embodiment of the invention.

FIG. 4 shows an initialization and configuration circuit for a programmable logic device according to one embodiment of the invention. The circuit includes a non-volatile memory 401, a sensing array 402, a volatile memory 403, and a control circuit 404. Each word WORD(0) through WORD (n) stored in non-volatile memory 401 includes a series of configuration data bits BIT(0) through BIT(m) and a transfer bit.

The sensing array 402 is coupled between an output port of the non-volatile memory 401 and an input port of the volatile memory 403. In one embodiment, sensing array 402 includes a plurality of sense amplifiers SA(0) through SA(m+1) that sense the values stored in the non-volatile memory. In the pictured embodiment, the values are then passed in parallel from sensing array 402 to volatile memory 403, where they are stored. The data transfer is performed under control of control circuit 404, which is coupled to control terminals of each memory.

Each word of data transferred between the two memories includes at least one transfer bit. In the pictured embodiment, only one transfer bit is included. Preferably, this transfer bit is stored in the non-volatile memory as a "programmed" value. The control circuit monitors the transfer bit as detected by the sensing circuit, and reinitiates the transfer process if the transfer bit is detected as an "erased" value.

Figure 5:
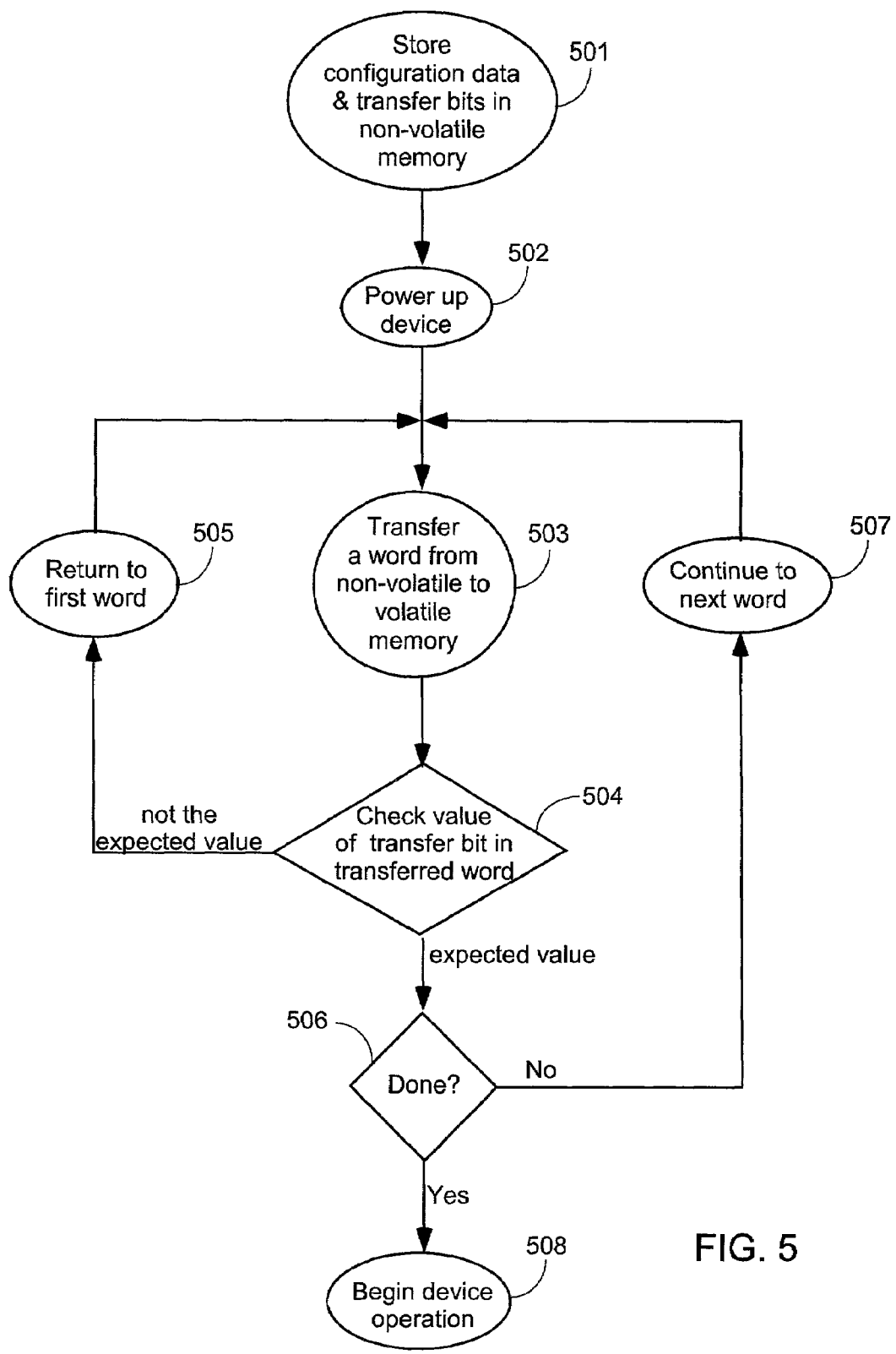
FIG. 5 is a flow diagram of a first method of transferring data from a non-volatile to a volatile memory according to another embodiment of the invention.

FIG. 5 shows a method of configuring a programmable logic device according to another embodiment of the invention. In step 501, configuration data for the device is stored in a non-volatile memory on the device. Each word of configuration data is stored with at least one transfer bit.

In step 502, the device is powered-up, possibly as part of a complete system that includes the device. In step 503, and preferably in response to the powering up of step 502, a data transfer is initiated between the non-volatile memory and a volatile memory on the device.

One word is transferred at a time between the two memories. The value that was sensed for the transfer bit is also checked during the transfer (step 504). If the value was stored as "programmed" and is detected as "erased", or was stored as "erased" and is detected as "programmed", the data transfer is re-initialized and the first word is re-transferred (step 505). If the value is detected as the expected value, then the data transfer is presumed to have been performed correctly. If there are more words to be transferred (as tested in step 506), the transfer process continues with the next word (step 507). If the data transfer is complete (i.e., if the transferred word was the last in the series to be transferred), then configuration is complete, and device operation begins at step 508.

Figure 6:
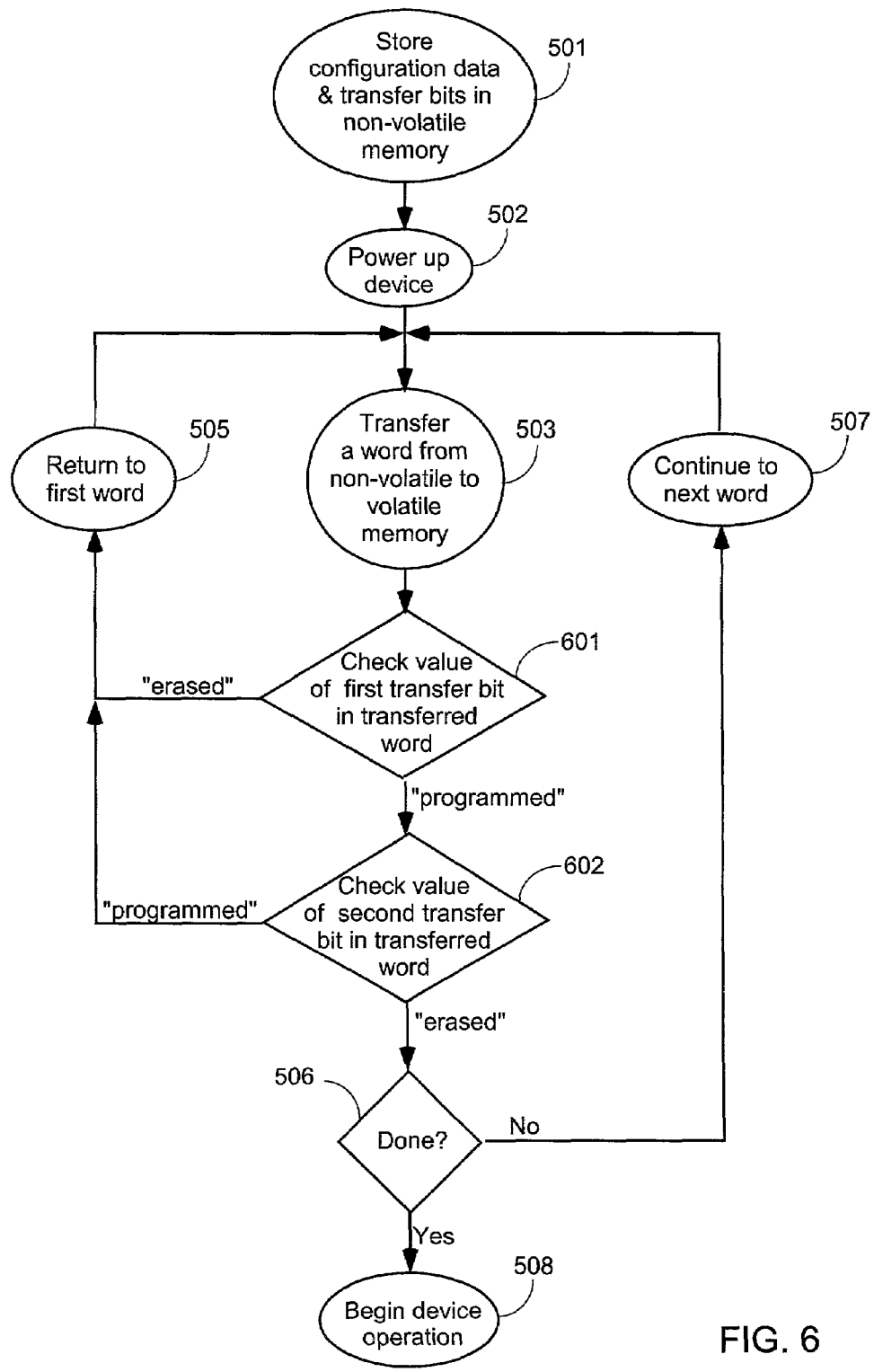
FIG. 6 is a flow diagram of a second method of transferring data from a non-volatile to a volatile memory according to another embodiment of the invention.

FIG. 6 shows another method of configuring a programmable logic device according to the invention. The method shown in FIG. 6 is similar to that of FIG. 5, except that in this embodiment two transfer bits are included in each word of configuration data. A first transfer bit is stored in the non-volatile memory with the "programmed" value. A second transfer bit is stored in the non-volatile memory with the "erased" value.

Therefore, the value check shown in FIG. 5 as step 504 is replaced with two separate value checks, performed in steps 601 and 602. If the "programmed" transfer bit is sensed as "erased" in step 601, or if the "erased" transfer bit is sensed as "programmed" in step 602, the memory transfer is reinitiated (step 505). Steps 601 and 602 can be performed in any order.

Figure 7:
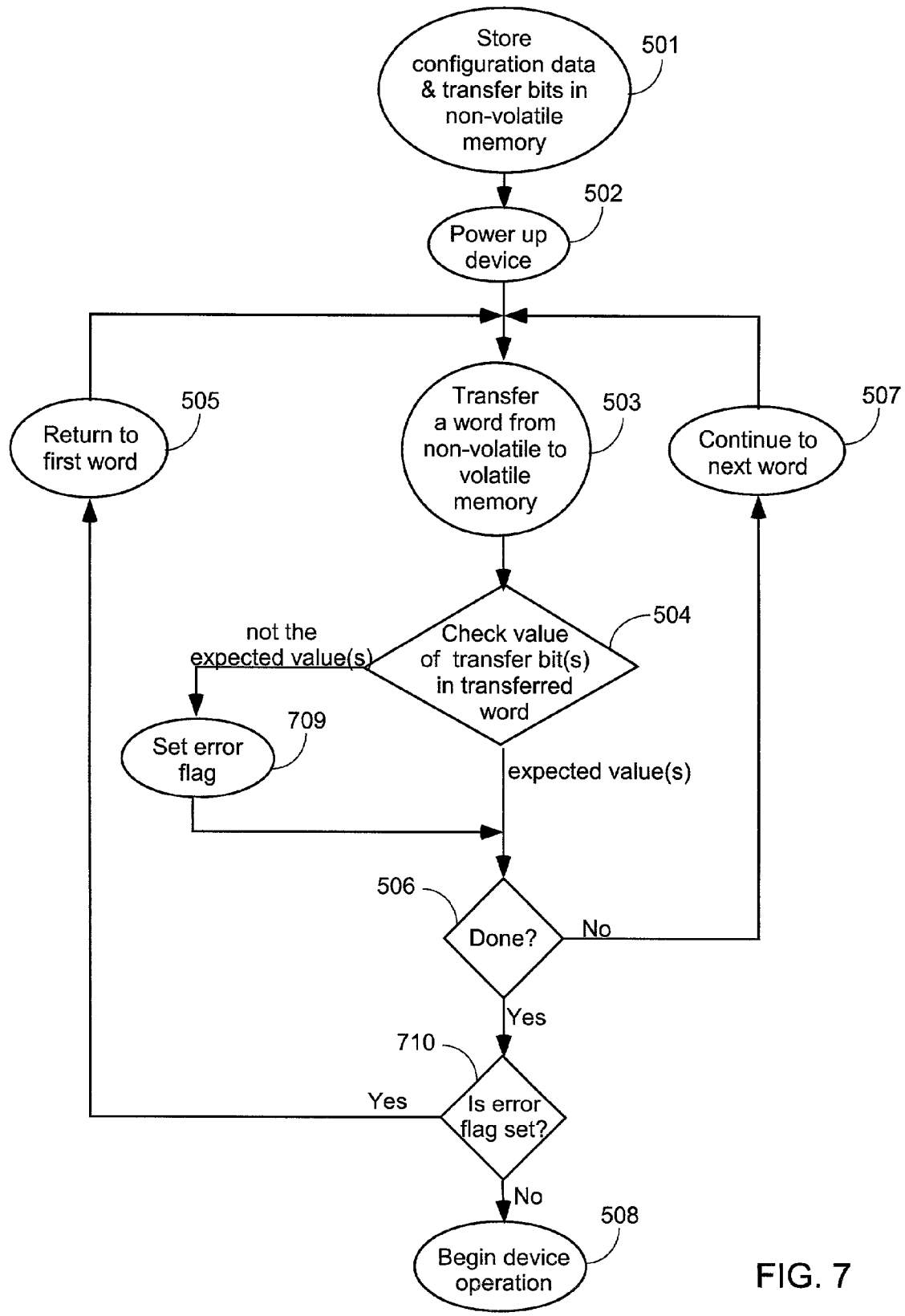
FIG. 7 is a flow diagram of a third method of transferring data from a non-volatile to a volatile memory according to another embodiment of the invention.

FIG. 7 shows another method of configuring a programmable logic device according to the invention. The method shown in FIG. 7 is similar to that of FIG. 5. The value of the transfer bit or bits is checked after each word (step 504). If one or more transfer bits show an unexpected result, an error flag is set in a memory storage device (step 709). In one embodiment, a latch is set when an expected result is detected, as described above. Whether or not the expected results are obtained, the data transfer continues to completion (step 506). At this point, the error flag is checked (step 710), and if an error was detected the memory transfer is reinitiated (step 505).

Those having skill in the relevant arts of the invention will now perceive various modifications and additions that may be made as a result of the disclosure herein. For example, the above text describes the methods and structures of the invention in the context of the transfer of configuration data in CPLDs. However, the invention can also be applied to the transfer of other types of data in other devices that include non-volatile and volatile memories. Further, non-volatile memories, volatile memories, sensing arrays, sense amplifiers, control circuits, and latches other than those described herein can be used to implement the invention. Moreover, some components are shown directly connected to one another while others are shown connected via intermediate components. In each instance, the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A method of configuring a programmable logic device including non-volatile and volatile memories, the non-volatile memory including a plurality of words comprising configuration data for the programmable logic device, each word including a first transfer bit having a first stored value that is one of a "programmed" value and an "erased" value, the method comprising:
   powering up the programmable logic device;
   setting a latch to a predetermined initialization value while powering up the programmable logic device;
   repeating the following sequence for a series of the words in the non-volatile memory, from a first word to a final word:
      transferring one of the words from the non-volatile memory to the volatile memory, and
      detecting a first detected value of the first transfer bit transferred from the non-volatile memory to the volatile memory;
   repeating, if the first detected value is different from the first stored value for any one word, transferring the first word from the non-volatile memory to the volatile memory; and
   for each transferred word, changing a value in the latch from the predetermined initialization value, if the first detected value is different from the first stored value.

2. The method of claim 1, further comprising:
   beginning operation of the programmable logic device after the final word is transferred and detected, if the first detected value for each word is the same as the first stored value for the same word.

3. The method of claim 1, further comprising:
   storing the plurality of words in the non-volatile memory prior to powering up the programmable logic device.

4. The method of claim 1, wherein the first transfer bit is in the same location of each word.

5. The method of claim 1, wherein each word further includes a second transfer bit having a second stored value, the second stored value being different from the first stored value.

6. The method of claim 5, further comprising:
for each transferred word, detecting a second detected value of the second transfer bit transferred from the non-volatile memory to the volatile memory; and
repeating, if the second detected value is different from the second stored value for any one word, transferring the first word from the non-volatile memory to the volatile memory.

7. The method of claim 1, wherein the programmable logic device is a CPLD.

8. The method of claim 1, wherein repeating transferring the first word is performed only after transferring the final word.

9. The method of claim 1, wherein repeating transferring the first word is performed after detecting a first detected value and before transferring the final word.

10. An apparatus for configuring a programmable logic device including non-volatile and volatile memories, the non-volatile memory including a plurality of words comprising configuration data for the programmable logic device, each word including a first transfer bit having a first stored value that is one of a "programmed" value and an "erased" value, the apparatus comprising:
means for powering up the programmable logic device;
means for setting a latch to a predetermined initialization value while powering up the programmable logic device;
means for transferring each of the words from the non-volatile memory to the volatile memory, in a sequence of words from a first word to a final word;
means for detecting for each word a first detected value of the first transfer bit transferred from the non-volatile memory to the volatile memory;
means for repeating, if the first detected value is different from the first stored value for any one word, transferring each of the words from the non-volatile memory to the volatile memory and detecting for each word a first detected value; and
means for changing, for each transferred word, a value in the latch from the predetermined initialization value, if the first detected value is different from the first stored value.

11. A method of transferring data from a non-volatile memory to a volatile memory in a circuit, the non-volatile memory including a plurality of words, each word including a first transfer bit having a first stored value that is one of a "programmed" value and an "erased" value, the method comprising:
powering up the circuit;
setting a latch to a predetermined initialization value while powering up the circuit;
repeating the following sequence in response to the powering up the circuit, for a series of the words in the non-volatile memory, from a first word to a final word:
transferring one of the words from the non-volatile memory to the volatile memory, and
detecting a first detected value of the first transfer bit transferred from the non-volatile memory to the volatile memory;
repeating, if the first detected value is different from the first stored value for any one word, transferring the first word from the non-volatile memory to the volatile memory; and changing, for each transferred word, a value in the latch from the predetermined initialization value, if the first detected value is different from the first stored value.

12. The method of claim 11, further comprising:
beginning operation of the circuit after the final word is transferred and detected, if the first detected value for each word is the same as the first stored value for the same word.

13. The method of claim 11, further comprising:
storing the plurality of words in the non-volatile memory prior to powering up the circuit.

14. The method of claim 11, wherein the first transfer bit is in the same location of each word.

15. The method of claim 11, wherein each word further includes a second transfer bit having a second stored value, the second stored value being different from the first stored value.

16. The method of claim 15, further comprising:
for each transferred word, detecting a second detected value of the second transfer bit transferred from the non-volatile memory to the volatile memory; and
repeating, if the second detected value is different from the second stored value for any one word, transferring the first word from the non-volatile memory to the volatile memory.

17. The method of claim 11, wherein the circuit is an integrated circuit (IC).

18. The method of claim 11, wherein the circuit is a programmable logic device.

19. The method of claim 11, wherein the programmable logic device is a CPLD.

20. The method of claim 11, wherein repeating transferring the first word is performed only after transferring the final word.

21. The method of claim 11, wherein repeating transferring the first word is performed after detecting a first detected value and before transferring the final word.

22. An apparatus for transferring data from a non-volatile memory to a volatile memory in a circuit, the non-volatile memory including a plurality of words, each word including a first transfer bit having a first stored value that is one of a "programmed" value and an "erased" value, the apparatus comprising:
means for powering up the circuit;
means for setting a latch to a predetermined initialization value while powering up the circuit;
means for transferring each of the words from the non-volatile memory to the volatile memory, in a sequence of words from a first word to a final word;
means for detecting for each word a first detected value of the first transfer bit transferred from the non-volatile memory to the volatile memory;
means for repeating, if the first detected value is different from the first stored value for any one word, transferring each of the words from the non-volatile memory to the volatile memory and detecting for each word a first detected value; and
means for changing, for each transferred word, a value in the latch from the predetermined initialization value, if the first detected value is different from the first stored value.

* * * * *